US012194657B2

(12) United States Patent
Cheng et al.

(10) Patent No.: US 12,194,657 B2
(45) Date of Patent: Jan. 14, 2025

(54) VARIABLE-STEP-DISTANCE MICRO-MILLING REPAIR CUTTER PATH GENERATING METHOD FOR DAMAGE POINTS ON SURFACE OF OPTICAL CRYSTAL

(71) Applicant: HARBIN INSTITUTE OF TECHNOLOGY, Harbin (CN)

(72) Inventors: Jian Cheng, Harbin (CN); Mingjun Chen, Harbin (CN); Wenqiang Wu, Harbin (CN); Qi Liu, Harbin (CN); Hao Yang, Harbin (CN); Linjie Zhao, Harbin (CN); Chao Tan, Harbin (CN); Xumeng Cheng, Harbin (CN); Henan Liu, Harbin (CN); Tingzhang Wang, Harbin (CN)

(73) Assignee: HARBIN INSTITUTE OF TECHNOLOGY, Harbin (CN)

( * ) Notice: Subject to any disclaimer, the term of this patent is extended or adjusted under 35 U.S.C. 154(b) by 790 days.

(21) Appl. No.: 17/524,762

(22) Filed: Nov. 12, 2021

(65) Prior Publication Data
US 2022/0152873 A1   May 19, 2022

(30) Foreign Application Priority Data
Nov. 13, 2020   (CN) .......................... 202011271286.9

(51) Int. Cl.
B28D 5/00      (2006.01)
B23C 3/00      (2006.01)
(Continued)

(52) U.S. Cl.
CPC .............. *B28D 5/007* (2013.01); *B23C 3/00* (2013.01); *B28D 5/0064* (2013.01); *G06F 17/11* (2013.01);
(Continued)

(58) Field of Classification Search
CPC ........ B28D 5/007; B28D 5/0064; B28D 5/00; G06F 17/11; G06F 17/16; G06F 17/17;
(Continued)

(56) References Cited
U.S. PATENT DOCUMENTS 10,576,585 B1 *  3/2020  Donofrio ........... B23K 26/0006
2021/0133365 A1 *  5/2021  Knight .................... G06F 30/23

OTHER PUBLICATIONS

Jee, Sungchul and Taehoon Koo, "Tool-path generation for NURBS surface machining," Proceedings of the 2003 American Control Conference, 2003., Denver, CO, USA, 2003, pp. 2614-2619 vol. 3, doi: 10.1109/ACC.2003.1243471. (Year: 2003).*

(Continued)

*Primary Examiner* — Rami R Okasha
(74) *Attorney, Agent, or Firm* — Nitin Kaushik

(57) ABSTRACT

A variable-step-distance micro-milling repair cutter path generating method for damage points on a surface of an optical crystal related to a field of optical material and optical element surface repair and includes steps of establishing a mathematical model of a repair profile; determining discrete contact points between a cutter and the repair profile to obtain a cutter contact control point set by a GPR path generating method to control a movement trend of a pseudo-random path; interpolating the cutter position control point set into a spatial curve by a NURBS modeling method; creating a UG curve in a UG software according to the mathematical model, and using the UG curve as the repair path to perform a machining process simulation. The method has good elimination effects on cutter marks with constant period and improves the ability of the KDP crystal to resist strong laser damage.

4 Claims, 4 Drawing Sheets

(51) Int. Cl.
    *G06F 17/11*    (2006.01)
    *G06F 17/16*    (2006.01)
    *G06F 30/17*    (2020.01)

(52) U.S. Cl.
    CPC .............. *G06F 17/16* (2013.01); *G06F 30/17* (2020.01); *B23C 2226/42* (2013.01); *B23C 2260/56* (2013.01); *B23C 2265/08* (2013.01)

(58) Field of Classification Search
    CPC . G06F 30/17; B23C 2226/42; B23C 2260/56; B23C 2265/08; B23C 3/00; G05B 19/19; G05B 19/182; G05B 19/4069; G05B 2219/35349
    See application file for complete search history.

(56) References Cited

OTHER PUBLICATIONS

Elhadj, S. et al. "Scalable process for mitigation of laser-damaged potassium dihydrogen phosphate crystal optic surface with removal of damaged antireflective coating", (Nov. 30, 2016), Lawrence Livermore National Laboratory, LLNL-NRNL-712417 (Year: 2016).*

* cited by examiner

VARIABLE-STEP-DISTANCE MICRO-MILLING REPAIR CUTTER PATH GENERATING METHOD FOR DAMAGE POINTS ON SURFACE OF OPTICAL CRYSTAL

TECHNICAL FIELD

The present disclosure relates to a field of optical material and optical element surface repair, and in particular to a variable-step-distance precision micro-milling repair method for laser damage points on a surface of a large-diameter KDP crystal component.

BACKGROUND

In pursuit of reliable and controllable clean nuclear fusion energy, countries around the world have built large-scale laser-driven Inertial Confinement Fusion (ICF) facilities, such as the National Ignition Facility (NIF) in the United States and the Shenguang Laser Facility (SG) in China. In such a huge laser system, thousands of large-aperture, high-precision, high-quality optical components are needed. KDP functional crystal materials are configured to make optical switches and frequency doubling components because of their unique optical properties, and become an irreplaceable core material in laser-driven ICF engineering at this stage. However, KDP materials have poor mechanical and physical properties, low fracture toughness, high water solubility, and high heat sensitivity, making preparation of high-quality, high-precision large-diameter KDP components a huge challenge. Meanwhile, a surface of the machined KDP crystal inevitably introduces manufacturing defects, such as microcracks, dents, and scratches. When the KDP crystal is irradiated by a strong laser, these surface micro-defects are likely to cause laser damage points on the surface, and as the number of laser hits increases, a size of these damage points increases sharply under laser irradiation, which greatly affects a light transmission performance and a service life of the KDP crystal. Studies have shown that if the damage points on the surface of the KDP component are small in size, and if the damage points are repaired and removed in time, the increase of the damage points is greatly alleviated. Therefore, precision repair of laser damage points on a surface of a high-power laser optical component or mitigation technology of damage growth has important engineering practical value.

In order to repair the laser damage points on a surface of a KDP crystal component, it is internationally believed that the precision micromechanical repair based on high-speed micro-milling of a ball-end milling cutter is the most promising damage repair method for the large-diameter KDP crystal component in view of a CO2 laser melting method, a water dissolution etching method, a ultra-short pulse laser ablation method, a micro-machining removal method, and other technologies, At present, with use of micro-milling technology, the surface damage portion is repaired into a "laser-friendly" repair profile such as cone type and a Gaussian type, which has successfully alleviated an expansion behavior of the damage points on the surface of the KDP crystal component. However, latest experimental results found that even with the best existing repair process parameters, the laser damage threshold (LIDT) of the KDP crystal element after micro-milling repair only recover to 85% of the intact surface. At this stage, a repair process of the KDP crystals is generally divided into two steps. First, damaged materials at the defect is quickly removed by a layer milling method, and then a "spiral" path is adopted to create a complex, smooth, and laser-friendly repair profile. In a "spiral" repair process of micro-milling, due to interaction between adjacent cutters during cutting, residual cutter marks (caused by residual height) are generated on a KDP repair contour surface after repair. The residual cutter marks have a constant period, which is roughly equal to a constant cutter path step distance. In actual use of KDP crystal elements, the strong laser in an ICF optical path system is extremely sensitive to the residual cutter marks with the constant period. Due to interference and diffraction effects of the laser, light intensity enhancement points are generated in an interior of the KDP crystals and an interior of downstream fused silica optical elements, which in turn cause new damage to the optical components.

Therefore, the present disclosure provides a new repair path generating method for laser damage on a surface of a KDP crystal component, which is Gaussian pseudo-random (GPR) micro-milling cutter path generating method, to relieve modulating effect of the residual cutter marks with constant period in conventional repair methods. Thus, an ability of the KDP crystal components to resist laser damage is further improved and a service life of the KDP crystal components is increased.

SUMMARY

In order to relieve modulating effect of residual cutter marks with constant period in the micro-milling repair of soft and brittle KDP crystals and improve an ability of the KDP crystals to resist laser damage and a service life of the KDP crystals, the present disclosure provides a variable-step-distance micro-milling repair cutter path generating method for damage points on a surface of an optical crystal (GPR variable-step-distance micro-milling repair cutter path generating method for a KDP crystal).

The method comprises following steps
  step 1: designing a damage repair profile with suitable depth and width according to a laser damage degree of a surface of a potassium dihydrogen phosphate (KDP) crystal and morphological characteristics of damage points: establishing a mathematical model of the damage repair profile;
  step 2: determining Gaussian pseudo-random (GPR) path generation parameters according to a processing requirement: determining discrete contact points between a cutter and the conical repair profile when the cutter is milling the conical repair profile to obtain a cutter contact control point set to control a movement trend of a pseudo-random path by a GPR path generating method;
  step 3: calculating central positions of a ball-end cutter one-to-one corresponding to the cutter contact control points to form a cutter position control point set by the established mathematical model of the repair profile and sizes of selected KDP crystal micro-milling cutters; where the central positions are defined as the cutter position control points;
  step 4: interpolating the cutter position control point set into a spatial curve by a non-uniform rational B-splines (NURBS) modeling method: a mathematical model of the spatial curve is multiple cubic equation sets controlled by a unique parameter;
  step 5: creating a graphical curve in a computer aided design software according to the mathematical model of the spatial curve, and using the graphical curve as the repair path to performed a machining process simulation; if a simulation result meets safety and manufacturability requirements of a machining cutter path, a step 6 is performed: if not, go back to the step 2 to check the processing requirement and adjust the GPR path generation parameters; and step 6: converting the machining process simulation of the step 5 into general NC codes: performing precision micro-milling repair on the KDP crystal on a KDP crystal repair machine: verifying correctness of the GPR variable-step-distance micro-milling repair cutter path generating method.

Furthermore, the damage repair profile in step 1 is a conical repair profile. A depth and a width of the conical repair profile are selected according to morphology, size and distribution of the damage points on the surface of the KDP crystal. The mathematical model of the conical repair profile is a quadric surface equation.

The processing requirement in step 2 is a cutting step distance corresponding to a conventional spiral milling path. The GPR path generation parameters comprise polar angle adjustment parameters and polar diameter offset. According to output parameters, a series of coordinates of the discrete contact points of a surface of the conical repair profile is calculated by a GPR algorithm. The discrete contact points are the cutter contact control points. When a cutter is milling the repair the conical repair profile, a contact point set to a theoretical surface is the spatial curve, and the cutter contact control points are configured to control a trend of the spatial curve:

The micro-milling cutter is the ball-end micro-milling cutter made of cubic boron nitride (CBN). The ball-end micro-milling cutter is configured to realize a plastic domain processing of a repair profile on the surface of the KDP crystal. When the ball-end micro-milling cutter performs milling motion on a surface of the conical repair profile of the KDP crystal, a sphere center motion path of the ball-end micro-milling cutter is the spatial curve that defined as a cutter motion path or the cutter path. A point at a distance of the cutter radius outward from a normal direction of a cutter contact point is defined as a cutter position control point. The cutter position control points are configured to control the trend of the cutter path.

In the step 4, the NURBS modeling method is used as the only mathematical method to define a geometric shape of industrial products in an industrial product data exchange standard. The cutter position control points are acted as curve value points, by the NURBS modeling method, to interpolate a $k^{th}$ NURBS spline curve.

In the step 5, a process of creating the graphical curve in the computer aided design software according to the mathematical model of the spatial curve means to save obtained curve equations as an .exp format file and import the .exp format file into the computer aided design software in an expression form to make a regular curve. An intuitive machining process simulation is performed to confirm safety and reliability of the machining process by driving the regular curve.

In the step 6, a process of converting the machining process simulation of step 5 into the NC codes depends on the post-processor of the computer aided design software.

The KDP crystal repair machine is a self-developed surface micro-defect fast search and micro-milling repair device for large-diameter KDP crystals (please refer to the CN application No. 201310744691.1), which realizes rapid scanning and precision micro-milling repair of surface defects on a 430 mm×430 mm KDP crystal.

A process of the variable-step-distance micro-milling repair cutter path generating method for the damage points on the surface of the optical crystal is as follow:

designing the damage repair profile with suitable depth and width according to the laser damage degree of the surface of the KDP crystal and the morphological characteristics of damage points: establishing a mathematical model of the damage repair profile: determining a conical repair profile as a laser-friendly repair profile.

Establishing a mathematical model of the conical repair profile, and its control equation is as follows:

$$z = f(x, y) = -\frac{D}{2h}\sqrt{x^2 + y^2} + h \quad (1)$$

x, y, and z respectively represent a Cartesian coordinate value of any point on the conical repair profile. D is a width of the conical repair profile. h is a depth of the conical repair profile. Since the mathematical model of the conical repair profile is a revolving model, if $\rho^2 = x^2 + y^2$, a coordinates of any point P on the conical repair profile is P=(x,y,z). The point P is expressed in polar coordinates as P=($\rho$, $\theta$) and satisfies:

$$\begin{cases} x = \rho \cos \theta \\ y = \rho \sin \theta \\ z = f(x, y) \end{cases} \quad (2)$$

Adopting a spiral repair path with a small cutting depth and a small step distance; generating pseudo-random cutter contact control points by adjusting polar angles and polar diameters under a GPR strategy;

When establishing a GPR path, a first cutter contact control point is initialized, and the first cutter contact control point is initialized to a point on an edge of the conical repair profile; where a polar angle is 0, where $$P_{CC}{}^0 = (D/2, 0) \quad (3)$$

Other cutter contact control points are generated by a polar diameter and polar angle control equation as follow:

$$\begin{cases} \theta_i = \theta_{i-1} + \frac{K}{\lg(\rho_{i-1}) + b} \\ \rho_i = \frac{D}{2} - \frac{\theta_i}{2\pi}\mu - \delta_i \end{cases}, i = 1, 2, 3, \ldots \quad (4)$$

The above formula gives a distribution law of an $i^{th}$ cutter contact control point Pi CC=($\rho_i, \theta_i$). In a circumferential direction of the conical repair profile, a polar angle $\theta_i$ gives a stepped size $$\frac{K}{\lg(\rho_{i-1}) + b}$$

related to $\rho_{i-1}$ on a basis of $\theta_{i-1}$. K and b are polar angle adjustment parameters. By adjusting values of K and b, a sparseness of the cutter contact control points in the conical repair profile under different polar diameters is adjusted. A pseudo-random processing is performed on the polar diameters in a radial direction of the conical repair profile.

$$\frac{D}{2} - \frac{\theta_i}{2\pi}\mu$$

is a pole diameter of the cutter contact control points on the spiral repair path, and $\delta_i$ is an offset of the cutter contact control points to the spiral repair path. When $\theta_i \in [0, 2\pi)$, $\delta_i = 0$. When $\theta_i \in [2\pi, +\infty)$, $\delta_i$ is a pseudo-random number that satisfies a Gaussian distribution $\delta_i \sim N(\mu, \sigma^2)$. $\sigma$ represents a standard deviation and is a pseudo-random adjustment parameter configured to adjust a change degree of the step distance.

Performing bandwidth constraint and adjacent constraint on a generation range of the pseudo-random number. In (5), $\varepsilon$ is a half-bandwidth of the pseudo-random number, and n is an adjacent constraint parameter of the cutter contact control points.

$$\begin{cases} |\delta_i| < \varepsilon \\ |\delta_i - \delta_{i-1}| < \eta \end{cases} \quad (5)$$

A spiral-like distribution of cutter contact control points is continuously introduced by performing formulas (4)-(6) until the cutter contact control points tangent to a bottom of the revolving model to form the cutter contact control point set:

The KDP crystal micro-milling cutter is a ball-end micro-milling cutter made of CBN. The cutter position control points $P_{CL}$ are obtained to form the cutter position control point set according to a direction of a curved surface at each of the cutter position control points and a radius Rc of the ball-end micro-milling cutter, where a calculation equation is as follows:

$$\begin{cases} P_{CL}^{(i)} = P_{CC}^{(i)} + R_c \frac{\vec{v}^{(i)}}{|\vec{v}^{(i)}|} \\ \vec{v}^{(i)} = \left(\frac{\partial f}{\partial x}, \frac{\partial f}{\partial y}, -1\right)\Big|_{x=x_i, y=y_i} \end{cases} \quad (6)$$

In the GPR strategy, the cutter position control points are the discrete contact points on the spiral repair path and are treated as value points:

There are n+1 points in the cutter position control point set. The n+1 points are discrete value points of a NURBS curve. The NURBS curve is a $k^{th}$ NURBS curve and is interpolated as the spiral repair path. A rational polynomial vector function of the NURBS curve is as follows:

$$p(u) = \frac{\sum_{i=0}^{n} \omega_i d_i N_{i,k}(u)}{\sum_{i=0}^{n} \omega_i N_{i,k}(u)} \quad (7)$$

$d_{ii}$ is a curve control vertex and is obtained by an inverse calculation of a cutter position control points $P_{CL}$. $\omega$ is defined as a weight factor and is configured to assign weights to the curve control vertex; in a KDP crystal repair model, each curve control vertex di has a same weight when generating the NURBS curve, so each weight factor $\omega_i=1$ (i=0,1, . . . ,n); $N_{i,k}(u)$ is a $k^{th}$ standard B-spline basis function defined by a node vector $U=[u_0, u_1, \ldots, u_{n+k+1}]$ according to a Cox-De Boor recurrence formula; wherein $$\begin{cases} N_{i,0}(u) = \begin{cases} 1, u_i \le u \le u_{i+1} \\ 0, \text{other} \end{cases} \\ N_{i,k}(u) = \frac{u - u_i}{u_{i+k} - u_i} N_{i,k-1}(u) + \frac{u_{i+k+1} - u}{u_{i+k+1} - u_{i+1}} N_{i+1,k-1}(u) \\ \text{define } \frac{0}{0} = 0 \end{cases} \quad (8)$$

In the GPR strategy, the n+1 cutter position control points $P_{CL}$ have a node vector $U=[u0, u1, \ldots, un+6]$. In order to determine a $u_{i+3}$ corresponding to Pi CL (i=0,1, . . . , n), the value points are parameterized. Considering a large change in distances between the cutter position control points, a cumulative chord length parameterization method of a formula (9) is applied to reflect a distribution of data points according to a chord length.

$$\begin{cases} u_0 = u_1 = u_2 = u_3 = 0 \\ u_{i+3} = u_{i+2} + \sqrt{|P_{CL}^i - P_{CL}^{i-1}|} \Big/ \\ \sum_{i=1}^{n} \sqrt{|P_{CL}^i - P_{CL}^{i-1}|}, i = 1, 2, \ldots, n-1 \\ u_{n+3} = u_{n+4} = u_{n+5} = u_{n+6} = 1 \end{cases} \quad (9)$$

As long as there are control vertices di, a NURBS repair path of the ball-end micro-milling cutters is calculated. Then weighted control vertices of the NURBS curve are inversely calculated;

For a cubic NURBS curve generated by n+1 $P_{CL}$, there are n+3 control vertices, and the cubic NURBS curve is defined as a formula (10), where $u \in [u_i, u_{i+1}] \subset [u_3, u_{n+3}]$.

$$p_i(u) = \sum_{j=i-3}^{i} d_j N_{j,k}(u) \quad (10)$$

$$p(u_{i+3}) = \sum_{j=i}^{i+3} d_j N_{j,3}(u_{i+3}) = P_{CL}^i, i = 0, 1, \ldots, n. \quad (11)$$

Substituting nodal values in a definition domain of the cubic NURBS curve into the equations in turn, and curves of different segments are continuous at the value points $P_{CL}$, which is defined as a formula (11); n+1 equations in the above formulas are not enough to determine n+3 unknown weighted control vertices, so two additional equations (12) given by boundary conditions:

$$p_0'(0) = \frac{3\frac{\omega_1}{\omega_0}(d_1 - d_0)}{u_4 - u_3}, p_n'(1) = \frac{3\frac{\omega_{n+1}}{\omega_{n+2}}(d_{n+2} - d_{n+1})}{u_{n+3} - u_{n+2}} \quad (12)$$

$$\begin{bmatrix} 1 & & & & \\ a_2 & b_2 & c_2 & & \\ & \ddots & \ddots & \ddots & \\ & & a_n & b_n & c_n \\ & & & & 1 \end{bmatrix} \cdot \begin{bmatrix} d_1 \\ d_2 \\ \vdots \\ d_n \\ d_{n+1} \end{bmatrix} = \begin{bmatrix} e_1 \\ e_2 \\ \vdots \\ e_n \\ e_{n+1} \end{bmatrix} \quad (13)$$

Linear equation sets in the equation (13) are obtained by additional conditions; and all weighted control vertices are obtained. Then the weighted control vertices are substituted into the equation (10) to obtain a NURBS curve equations set after interpolation of $P_{CL}$. There are n sets of the linear equation sets, and each of the linear equation sets has three equations. The three equations are the equations of u on x, y, and z components of a curve between adjacent $P_{CL}$. The three equations are second-order continuous at the $P_{CL}$. The parameter equation is used as the repair path of the KDP crystal to realize digitization of the repair path, and an only related parameter is u.

A calculated NURBS curve equation is imported into the computer aided design software; performed the machining process simulation in a curve-driven manner, then whether the simulation result meets the safety and manufacturability requirements of the machining cutter path is checked: if the simulation result meets the safety and manufacturability requirements of the machining cutter path, the step 6 is performed. if not, return to step 2 to check the process and modify the GPR path generation parameters σ

A conventional repair process simulation and a GPR variable-step-distance repair process simulation are converted into the NC codes through the post-processor of the computer aided design software, and the precision micro-milling repair of the KDP crystal is performed on the KDP crystal repair machine.

The present disclosure is a path generating method that overcomes the cutter marks with constant period pattern generated during the conventional micro-milling repair of the surface of the KDP crystal and realizes modeling of the repair path. By modifying model parameters, different cutter paths with different pseudo-random step distances (variable step distances) are generated. It has been verified that the present disclosure has a good elimination effect on the cutter marks with constant period, which improves an ability of the KDP crystal to resist strong laser damage.

The conventional repair path is obtained through reasonable selection of process parameters in the computer-aided manufacturing software [UG] computer aided design, and an output result of the conventional repair path is NC codes composed of discrete points. The variable-step-distance micro-milling repair cutter path generating method of the present disclosure models the space path, and realizes arbitrary control of any repair path.

The present disclosure converts the repair path into the mathematical model, so that the cutter path is no longer a collection of discrete cutter position points, but a continuous curve. Any point on the curve has a corresponding coordinate from the mathematical model, which makes the cutter position control points in the NC codes controllable.

In the present disclosure, the constant step distance is replaced with the pseudo-random step distance, and the surface of the KDP crystal after the GPR path repair no longer has the cutter marks with constant step distance, which disrupts an original period of the cutter marks. By comparing features on the repaired surface of the KDP crystal, it is proved that the cutter marks with constant step distance are greatly reduced, which is of great significance in further improving resistance to laser damage of the KDP crystal after micro-milling repair.

DETAILED DESCRIPTION

Figure 1:
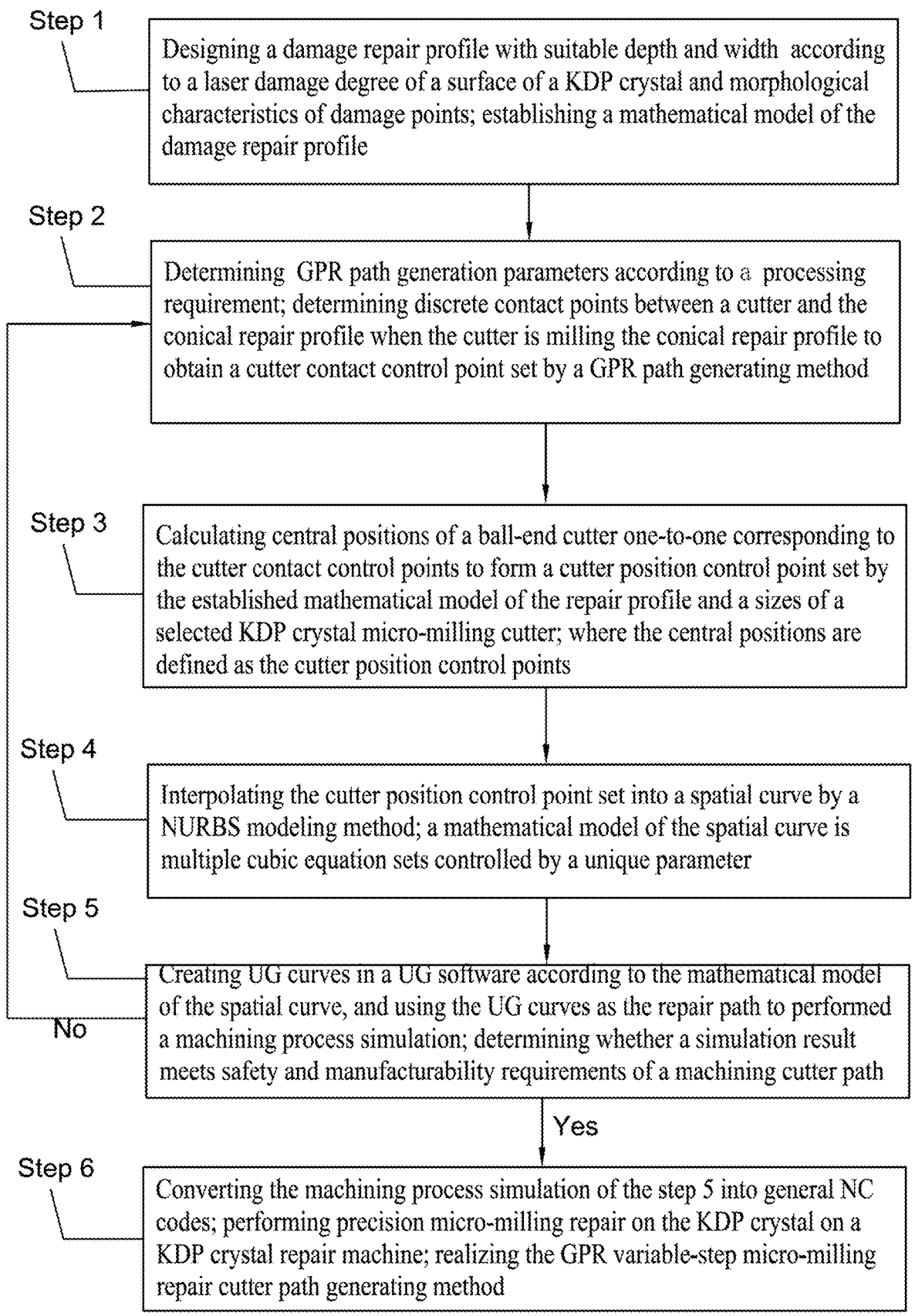
FIG. 1 is a flow chart of a GPR micro-milling repair cutter path generating method for damage points on a surface of a large-diameter KDP crystal.

In an example analysis of GPR micro-milling repair cutter path generating method for damage points on a surface of a KDP crystal, an experimental verification of a variable-step-distance repair path generating method is verified according to a process shown in FIG. 1.

A process of the variable-step-distance micro-milling repair cutter path generating method for the damage points on the surface of the optical crystal is as follow:

1) designing a damage repair profile with a suitable depth and width according to a laser damage degree of the surface of the KDP crystal and the morphological characteristics of damage points: establishing a mathematical model of the damage repair profile;

A laser damage experiment shows that laser damage due to ablation often occurs on the surface if the KDP crystal, which is characterized by large damage area and shallow depth. The conical repair profile is able to remove the damaged area well. Verification by optical simulation shows that the conical repair profile is a laser-friendly repair profile, which effectively improves ability of the KDP crystal to resist laser damage after repair.

Establishing a mathematical model of the conical repair profile by computer technologies, and its control equation is as follows:

$$z = f(x, y) = -\frac{D}{2h}\sqrt{x^2 + y^2} + h \qquad (1)$$

x, y, and z respectively represent a Cartesian coordinate value of any point on the conical repair profile. D is a width of the conical repair profile. h is a depth of the conical repair profile. Since the mathematical model of the conical repair profile is a revolving model, if $\rho 2=x2+y2$, a coordinates of any point P on the conical repair profile is P=(x,y,z). The point P is expressed in polar coordinates as P=(p, θ) and satisfies:

$$\begin{cases} x = \rho\cos\theta \\ y = \rho\sin\theta \\ z = f(x, y) \end{cases} \qquad (2)$$

2) In a conventional repair method, computer aided design software is adopted to generate two processes of cavity milling (layer milling) and area profile milling (spiral milling). A purpose of the cavity milling is to quickly remove ablated portions of the damaged points and initially mill out the conical repair profile. Therefore, a large step distance and large depth of cut repair process is used in a molding area. A purpose of area profile milling is to further improve a surface quality of the repair profile and process a "laser-friendly" smooth repair profile, so a spiral repair path with a small cutting depth and a small step distance is adopted.

Pseudo-random cutter contact control points are generated by adjusting polar angles and polar diameters under a GPR strategy. When establishing a GPR path, a first cutter contact control point is initialized, and the first cutter contact control point is initialized to a point on an edge of the conical repair profile: where a polar angle is 0, where $$P_{CC}^0 = (D/2, 0) \tag{3}$$

Other cutter contact control points are generated by a polar diameter and polar angle control equation as follow:

$$\begin{cases} \theta_i = \theta_{i-1} + \dfrac{K}{\lg(\rho_{i-1}) + b} \\ \rho_i = \dfrac{D}{2} - \dfrac{\theta}{2\pi}\mu - \delta_i \end{cases}, i = 1, 2, 3, \ldots \tag{4}$$

The above formula gives a distribution law of an $i^{th}$ cutter contact control point Pi CC=$(\rho_i, \theta_i)$. In a circumferential direction of the conical repair profile, a polar angle $\theta i$ gives a stepped size $$\frac{K}{\lg(\rho_{i-1}) + b}$$

related to $\rho_{i-1}$ on a basis of $\theta_{i-1}$. K and b are polar angle adjustment parameters. By adjusting values of K and b, a sparseness of the cutter contact control points in the conical repair profile under different polar diameters is adjusted. A pseudo-random processing is performed on the polar diameters in a radial direction of the conical repair profile.

$$\frac{D}{2} - \frac{\theta_i}{2\pi}\mu$$

is a pole diameter of the cutter contact control points on the spiral repair path, and $\delta_i$ is an offset of the cutter contact control points to the spiral repair path. When $\theta_i \in [0, 2\pi)$, $\delta_i = 0$. When $\theta_i \in [2\pi, +\infty)$, $\delta_i$ is a pseudo-random number that satisfies a Gaussian distribution $\delta_i \sim N(\mu, \sigma^2)$. $\sigma$ represents a standard deviation and is a pseudo-random adjustment parameter configured to adjust a change degree of the step distance:

In order to prevent the pseudo-random cutter contact control points from appearing in uncontrollable positions with a small probability, bandwidth constraint and adjacent constraint as shown in formula (5) are performed on a generation range of the pseudo-random number. In (5), $\varepsilon$ is a half-bandwidth of the pseudo-random number, and $\eta$ is an adjacent constraint parameter of the cutter contact control points.

$$\begin{cases} |\delta_i| < \varepsilon \\ |\delta_i - \delta_{i-1}| < \eta \end{cases} \tag{5}$$

A spiral-like distribution of cutter contact control points is continuously introduced by performing formulas (4)-(6) until the cutter contact control points tangent to a bottom of the revolving model to form the cutter contact control point set:

3) The KDP crystal micro-milling cutter is a ball-end micro-milling cutter made of CBN. Theoretically, when doing milling motion, the ball-end micro-milling cutter and the conical repair profile are only tangent at one point. The cutter position control points $P_{CL}$ are obtained to form the cutter position control point set according to a direction of a curved surface at each of the cutter position control points and a radius Rc of the ball-end micro-milling cutter, where a calculation equation is as follows:

$$\begin{cases} P_{CL}^{(i)} = P_{CC}^{(i)} + R_c \dfrac{\overrightarrow{v^{(i)}}}{|\overrightarrow{v^{(i)}}|} \\ \overrightarrow{v^{(i)}} = \left( \dfrac{\partial f}{\partial x}, \dfrac{\partial f}{\partial y}, -1 \right) \Big|_{x=x_i, y=y_i} \end{cases} \tag{6}$$

4) There are two forms of NURBS curve in the actual use. One form is that the control vertex is given to find a curve expression or any point on the NURBS curve, which is defined as a forward calculation problem. The other form is to find the curve expression or any point on the NURBS curve when several value points on the NUBRS curve are given. In the process, it is necessary to inversely calculate the curve control vertex, so it is defined as an inverse calculation problem. In the GPR strategy, the cutter position control points are the discrete contact points on the spiral repair path and are treated as value points. Therefore, the interpolation of the repair path in the GPR strategy is the inverse calculation problem.

There are n+1 points in the cutter position control point set. The n+1 points are discrete value points of a NURBS curve. The NURBS curve is a $k^{th}$ NURBS curve and is interpolated as the spiral repair path. A rational polynomial vector function of the NURBS curve is as follows:

$$p(u) = \frac{\sum_{i=0}^{n} \omega_i d_i N_{i,k}(u)}{\sum_{i=0}^{n} \omega_i N_{i,k}(u)} \tag{7}$$

$d_{ii}$ is a curve control vertex and is obtained by an inverse calculation of a cutter position control points $P_{CL}$. $\omega_i$ is defined as a weight factor and is configured to assign weights to the curve control vertex; in a KDP crystal repair model. Each curve control vertex di has a same weight when generating the NURBS curve, so each weight factor $\omega_i = 1$ (i=0,1, . . . ,n); Ni,k (u) is a $k^{th}$ standard B-spline basis function defined by a node vector U= $[u_0, u_1, \ldots, u_{n+k+1}]$ according to a Cox-De Boor recurrence formula; wherein $$\begin{cases} N_{i,0}(u) = \begin{cases} 1, u_i \le u \le u_{i+1} \\ 0, \text{other} \end{cases} \\ N_{i,k}(u) = \dfrac{u - u_i}{u_{i+k} - u_i} N_{i,k-1}(u) + \dfrac{u_{i+k+1} - u}{u_{i+k+1} - u_{i+1}} N_{i+1,k-1}(u) \\ \text{define } \dfrac{0}{0} = 0 \end{cases} \tag{8}$$

According to the above formulas, if k=3, the NURBS curve is a cubic NURBS curve. In the GPR strategy, the n+1 cutter position control points $P_{CL}$ have a node vector U=[u0, u1, . . . ,un+6]. In order to determine a $u_{i+3}$ corresponding to Pi CL (i=0,1, . . . , n), the value points are parameterized. Considering a large change in distances between the cutter position control points, a cumulative chord length parameterization method of a formula (9) is applied to reflect a distribution of data points according to a chord length.

$$\begin{cases} u_0 = u_1 = u_2 = u_3 = 0 \\ u_{i+3} = u_{i+2} + \sqrt{|P^i_{CL} - P^{i-1}_{CL}|} \Big/ \\ \sum_{i=1}^{n} \sqrt{|P^i_{CL} - P^{i-1}_{CL}|}, \, i = 1, 2, \ldots, n-1 \\ u_{n+3} = u_{n+4} = u_{n+5} = u_{n+6} = 1 \end{cases} \quad (9)$$

As long as there are control vertices di, a NURBS repair path of the ball-end micro-milling cutters is calculated. Then weighted control vertices of the NURBS curve are inversely calculated;

For a cubic NURBS curve generated by n+1 $P_{CL}$, there are n+3 control vertices, and the cubic NURBS curve is defined as a formula (10), where $u \in [u_i, u_{i+1}] \subset [u_3, u_{n+3}]$.

$$p_i(u) = \sum_{j=i-3}^{i} d_j N_{j,k}(u) \quad (10)$$

$$p(u_{i+3}) = \sum_{j=i}^{i+3} d_j N_{j,3}(u_{i+3}) = P^i_{CL}, \, i = 0, 1, \cdots, n. \quad (11)$$

Substituting nodal values in a definition domain of the cubic NURBS curve into the equations in turn, and curves of different segments are continuous at the value points $P_{CL}$, which is defined as a formula (11); n+1 equations in the above formulas are not enough to determine n+3 unknown weighted control vertices, so two additional equations (12) given by boundary conditions:

$$p'_0(0) = \frac{3 \frac{\omega_1}{\omega_0}(d_1 - d_0)}{u_4 - u_3}, \, p'_n(1) = \frac{3 \frac{\omega_{n+1}}{\omega_{n+2}}(d_{n+2} - d_{n+1})}{u_{n+3} - u_{n+2}} \quad (12)$$

$$\begin{bmatrix} 1 & & & & \\ a_2 & b_2 & c_2 & & \\ & \ddots & \ddots & \ddots & \\ & & a_n & b_n & c_n \\ & & & & 1 \end{bmatrix} \cdot \begin{bmatrix} d_1 \\ d_2 \\ \vdots \\ d_n \\ d_{n+1} \end{bmatrix} = \begin{bmatrix} e_1 \\ e_2 \\ \vdots \\ e_n \\ e_{n+1} \end{bmatrix} \quad (13)$$

Linear equation sets in the equation (13) are obtained by additional conditions; and all weighted control vertices are obtained. Then the weighted control vertices are substituted into the equation (10) to obtain a NURBS curve equations set after interpolation of $P_{CL}$. There are n sets of the linear equation sets, and each of the linear equation sets has three equations. The three equations are the equations of u on x, y, and z components of a curve between adjacent $P_{CL}$. The three equations are second-order continuous at the $P_{Cl}$. The parameter equation is used as the repair path of the KDP crystal to realize digitization of the repair path, and an only related parameter is u.

5) The conventional repair process is to establish the damage points and a cutter model in the computer aided design software. After setting process parameters, the post-processor generates the NC codes that is able to be recognized by the KCP crystal repair machine. The GPR repair method is to calculate a repair path according to a geometric model, and any point on the repair path has a value u corresponding to it. Therefore, in theory, the coordinates of any point is able to be output to the NC codes.

Figure 2:
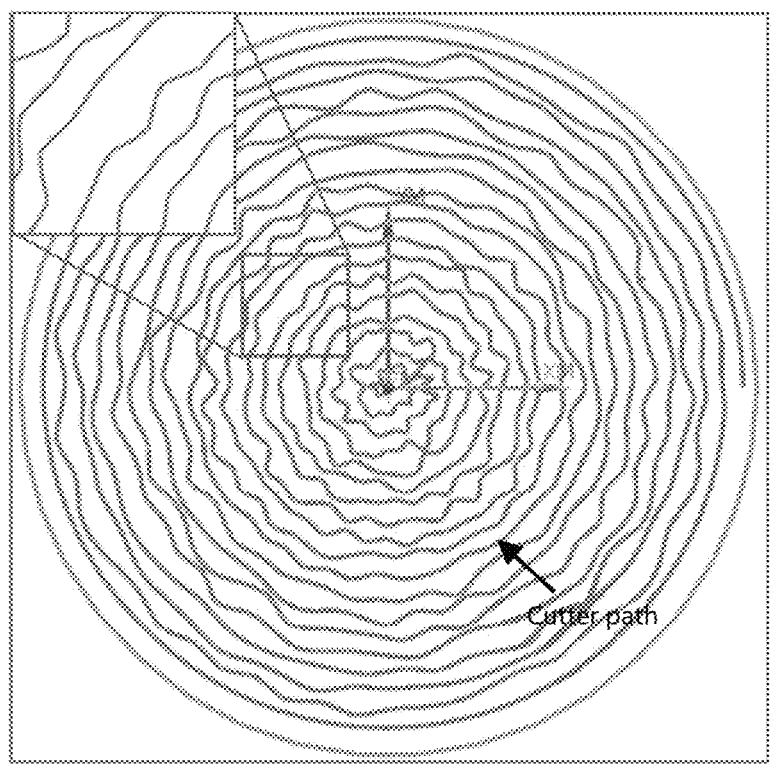
FIG. 2 is a schematic diagram of a variable-step-distance cutter repair path.

The present disclosure combines numerical calculation and computer-aided manufacturing technology and in the present disclosure, a calculated NURBS curve equation is imported into a CAM module of the computer aided design software; as shown in FIG. 2, the machining process simulation is performed in a curve-driven manner, then whether the simulation result meets the safety and manufacturability requirements of the machining cutter path is checked; if the simulation result meets the safety and manufacturability requirements of the machining cutter path, the step 6 is performed: if not, return to step 2 to check the process and modify the GPR path generation parameters σ.

6) A conventional repair process simulation and a GPR variable-step-distance repair process simulation are converted into the NC codes through the post-processor of the computer aided design software, and the precision micro-milling repair of the KDP crystal is performed on the KDP crystal repair machine.

The width of the conical repair profile is 800 μm, the depth of the width of the conical repair profile is 40 μm, and an average step distance u of the area profile milling and GPR repair methods are both 20 μm, taking σ=5 μm, ε=2σ, and n as a large number. After the processing was completed, a white light interferometer is configured to measure morphology information of the repaired surface of the KDP crystal. The morphology comparison is shown in FIG. 3A and FIG. 3B.

Figure 3A:
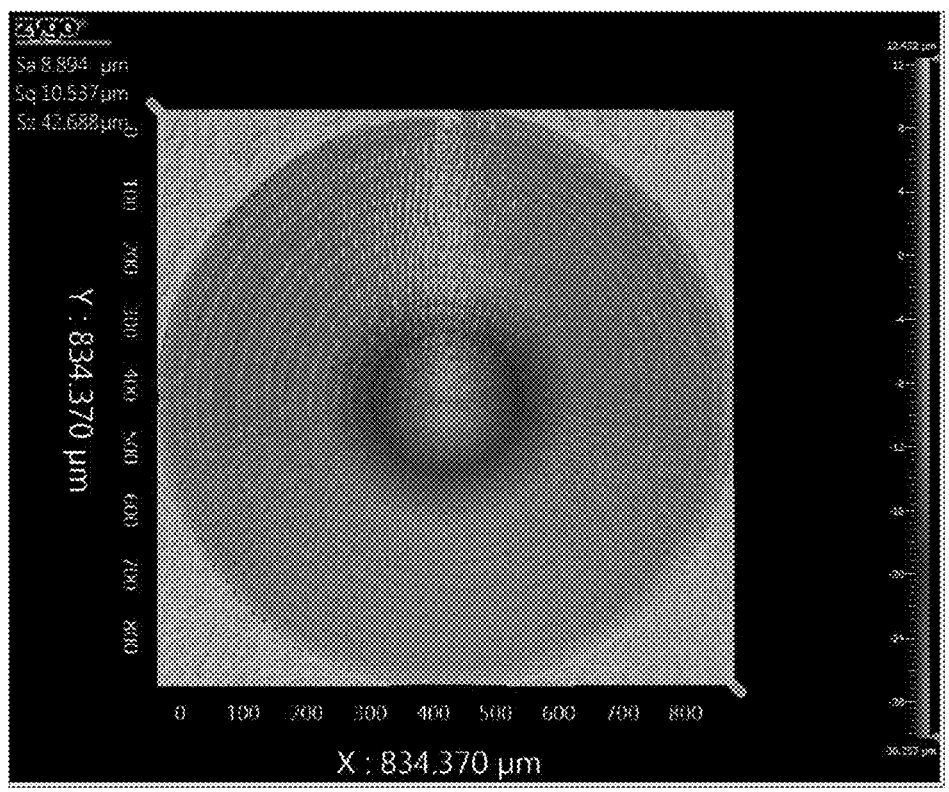
FIG. 3A is a schematic diagram of an obtained repair morphology of the KDP crystal after the conventional repair.
Figure 3B:
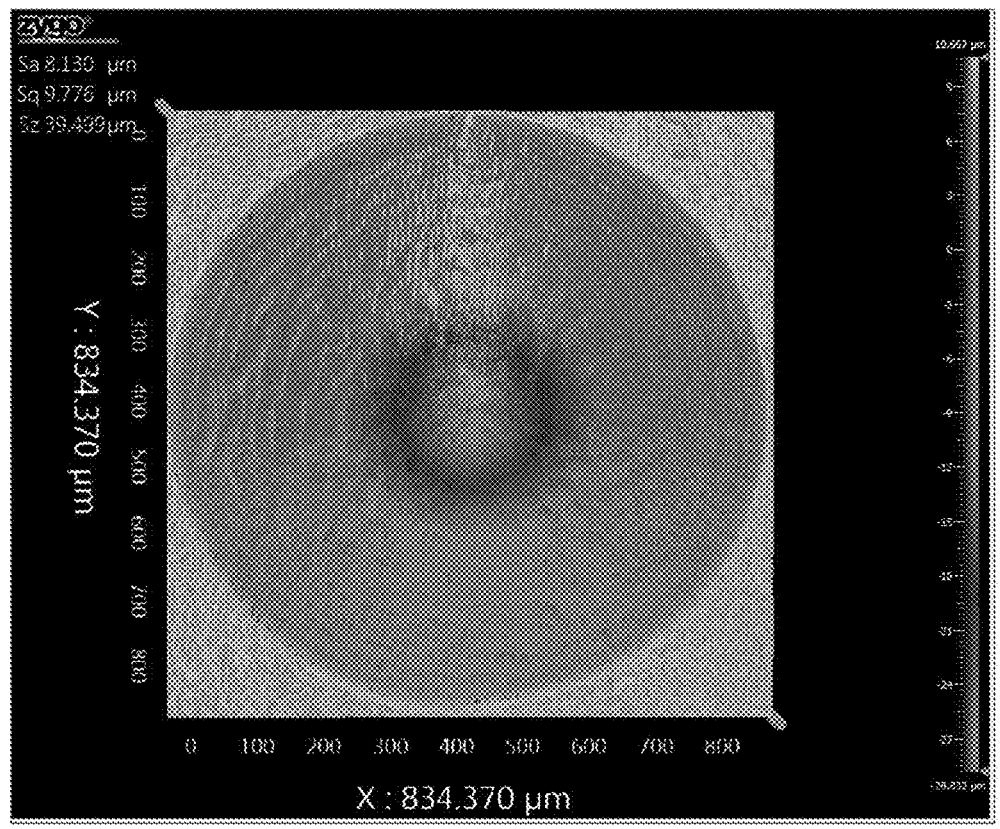
FIG. 3B is a schematic diagram of an obtained a repair morphology of the KDP crystal after the variable-step-distance repair of the present disclosure.

From the morphology comparison of FIG. 3A and FIG. 3B, it can be seen that a period of cutter marks is significantly reduced in the repair profile processed by the GPR repair method. In order to analyze periodicity of the cutter marks, the present disclosure adopts the power spectral density (14) to characterize it. The power spectral density is a way to extract frequency information in wave signals through Fourier transform, which reflects different frequency components in complex wave signals.

$$PSD(f) = \frac{1}{2\pi N} \left| \sum_{n=0}^{N} (S(x_i) - P(x_i)) e^{-j2\pi fn} \right|^2 \quad (14)$$

Figure 4:
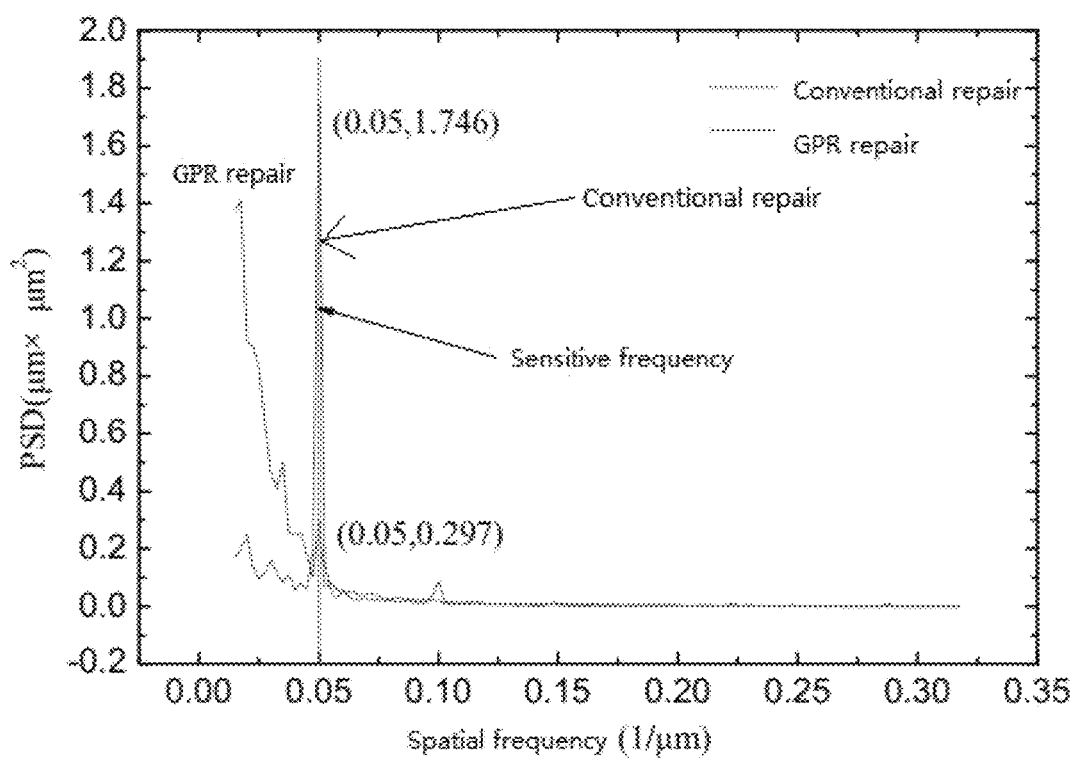
FIG. 4 a schematic diagram showing PSD curves of different repair methods.

N is the number of radial sampling points, f is the spatial frequency (the reciprocal of the distance). S (xi) is a profile of a radial cross-section. P (xi) is the minimum square line of S (xi). The calculated PSD curves of the two repair profile are shown in FIG. 4.

When the step distance of the repair path is 20 μm, an inherent knife frequency of the repair path is 0.05 μm−1. An existence of the frequency information greatly enhances interference diffraction effect of the KDP crystal in the laser environment. By calculating the PSD curve of the entire repair profile, the PSD value of a sensitive frequency band is reduced from 1.746 μm*μm2 to 0.297 μm*μm2 after processed by the GPR repair method, that is, a drop is 83.0%. It should be noted that the PSD value of middle and low frequency bands has increased to a certain extent.

This is because that a residual height of the GPR repair profile is high in some positions and is low in some other positions, which eventually causes straightness of the sampling points to decrease and the low frequency components to increase. However, these residual cutter marks of low frequency and nanometer amplitude do not negatively affect the laser damage resistance of the repaired KDP crystal.

The above steps adopts the process flow of the present disclosure to realize generation of variable-step-distance repair path for the KDP crystal, which proves that the present disclosure has a good elimination effect on cutter marks with constant period and improves the ability of the KDP crystal to resist strong laser damage.

What is claimed is:

1. A variable-step-distance micro-milling repair cutter path generating method for damage points on a surface of an optical crystal, comprising:

step 1: designing a damage repair profile with suitable depth and width according to a laser damage degree of a surface of a potassium dihydrogen phosphate (KDP) crystal and morphological characteristics of damage points; establishing a mathematical model of the damage repair profile; determining a conical repair profile as a laser-friendly repair profile;

establishing a mathematical model of the conical repair profile, and a control equation is as follows:

$$z = f(x, y) = -\frac{D}{2h}\sqrt{x^2 + y^2} + h \quad (1)$$

wherein x, y, and z respectively represent a Cartesian coordinate value of any point on the conical repair profile; D is a width of the conical repair profile; h is a depth of the conical repair profile;

since the mathematical model of the conical repair profile is a revolving model, if $\rho^2 = x^2 + y^2$, coordinates of any point P on the conical repair profile is P=(x,y,z); the point P is expressed in polar coordinates as P=($\rho$, $\theta$) and satisfies:

$$\begin{cases} x = \rho\cos\theta \\ y = \rho\sin\theta \\ z = f(x, y) \end{cases} \quad (2)$$

step 2: determining Gaussian pseudo-random (GPR) path generation parameters according to a processing requirement; determining discrete contact points between a cutter and the conical repair profile when the cutter is milling the conical repair profile to obtain a cutter contact control point set by a GPR path generating method;

wherein the cutter contact control point set is configured to control a movement trend of a pseudo-random path; a process is as follow:

adopting a spiral repair path with a cutting depth and a step distance; generating pseudo-random cutter contact control points by adjusting polar angles and polar diameters under a GPR strategy; when establishing a GPR path, a first cutter contact control point is initialized, and the first cutter contact control point is initialized to a point on an edge of the conical repair profile where a polar angle is 0, wherein $$P_{CC}{}^0 = (D/2, 0) \quad (3)$$

other cutter contact control points are generated by a polar diameter and polar angle control equation as follow:

$$\begin{cases} \theta_i = \theta_{i-1} + \dfrac{K}{lg(\rho_{i-1}) + b} \\ \rho_i = \dfrac{D}{2} - \dfrac{\theta_i}{2\pi}\mu - \delta_i \end{cases} \quad (4)$$

$i = 1, 2, 3, \cdots$ a formula (4) gives a distribution law of an $i^{th}$ cutter contact control point $P_{iCC}=(\rho_i, \theta_i)$; in a circumferential direction of the conical repair profile, a polar angle $\theta_i$ gives a stepped size $$\frac{K}{lg(\rho_{i-1}) + b}$$

related to $\rho_{i-1}$ on a basis of $\theta_{i-1}$: K and b are polar angle adjustment parameters; by adjusting values of K and b, a sparseness of the cutter contact control points in the conical repair profile under different polar diameters is adjusted; a pseudo-random processing is performed on the polar diameters in a radial direction of the conical repair profile; where $$\frac{D}{2} - \frac{\theta_i}{2\pi}\mu$$

is a pole diameter of the cutter contact control points on the spiral repair path, and $\delta_i$ is an offset of the cutter contact control points to the spiral repair path; when $\theta_i \in [0, 2\pi)$, $\delta_i = 0$; when $\theta_i \in [2\pi, +\infty)$, $\delta_i$ is a pseudo-random number that satisfies a Gaussian distribution $\delta_i \sim N(\mu, \sigma^2)$; $\mu$ represents a mean; $\sigma$ represents a standard deviation and is a pseudo-random adjustment parameter configured to adjust a change degree of the step distance;

bandwidth constraint and adjacent constraint are performed on a generation range of the pseudo-random number; in (5), $\varepsilon$ is a half-bandwidth of the pseudo-random number, and n is an adjacent constraint parameter of the cutter contact control points, $$\begin{cases} |\delta_i| < E \\ |\delta_i - \delta_{i-1}| < \eta \end{cases} \quad (5)$$

a spiral-like distribution of cutter contact control points is continuously introduced by performing formulas (4)-(5) until the cutter contact control points tangent to a bottom of the revolving model to form the cutter contact control point set;

step 3: calculating central positions of a ball-end cutter one-to-one corresponding to the cutter contact control points to form a cutter position control point set by the established mathematical model of the repair profile and a size of a selected KDP crystal micro-milling cutter; wherein the central positions are defined as the cutter position control points;

wherein the KDP crystal micro-milling cutter is a ball-end micro-milling cutter made of cubic boron nitride (CBN); the cutter position control points $P_{CL}$ are obtained to form the cutter position control point set according to a direction of a curved surface at each of the cutter position control points and a radius $R_c$ of the ball-end micro-milling cutter, where a calculation equation is as follows:

$$\begin{cases} P_{CL}^{(j)} = P_{CC}^{(j)} + R_c \dfrac{\vec{v^{(j)}}}{|\vec{v^{(j)}}|} \\ \vec{v^{(j)}} = \left(\dfrac{\partial f}{\partial x}, \dfrac{\partial f}{\partial y}, -1\right)\Big|_{x=x_i, y=y_i} \end{cases} \quad (6)$$

step 4: interpolating the cutter position control point set into a spatial curve by a non-uniform rational B-splines (NURBS) modeling method; a mathematical model of the spatial curve is multiple cubic equation sets controlled by a unique parameter;

wherein in the GPR strategy, the cutter position control points are the discrete contact points on the spiral repair path and are treated as value points; there are n+1 points in the cutter position control point set, the n+1 points are discrete value points of a $k^{th}$ NURBS curve; the $k^{th}$ NURBS curve is interpolated as the spiral repair path; a rational polynomial vector function of the NURBS curve is as follows:

$$p(u) = \dfrac{\sum_{i=0}^{n} \omega_i d_i N_{i,k}(u)}{\sum_{i=0}^{n} \omega_i N_{i,k}(u)} \quad (7)$$

wherein $d_{ii}$ is a curve control vertex and is obtained by an inverse calculation of a cutter position control points $P_{CL}$; $\omega_i$ is defined as a weight factor and is configured to assign weights to the curve control vertex; in a KDP crystal repair model, each curve control vertex $d_i$ has a same weight when generating the NURBS curve, so each weight factor $\omega_i=1$ (i=0,1, . . . ,n); $N_{i,k}(u)$ is a $k^{th}$ standard B-spline basis function defined by a node vector $U=[u_0, u_1, \ldots, u_{n+k+1}]$ according to a Cox-De Boor recurrence formula; wherein $$\begin{cases} N_{i,0}(u) = \begin{cases} 1, u_i \leq u \leq u_{i+1} \\ 0, \text{other} \end{cases} \\ N_{i,k}(u) = \dfrac{u - u_i}{u_{i+k} - u_i} N_{i,k-1}(u) + \dfrac{u_{i+k+1} - u}{u_{i+k+1} - u_{i+1}} N_{i+1,k-1}(u) \\ \text{define } \dfrac{0}{0} = 0 \end{cases} \quad (8)$$

in the GPR strategy, the n+1 cutter position control points $P_{CL}$ have a node vector $U=[u_0, u_1, \ldots, u_{n+6}]$, in order to determine a $u_{i+3}$ corresponding to $P_{CL}^i$ (i=0,1, . . . , n), the value points are parameterized, $u_{i+3}$ represent a chord length; considering a large change in distances between the cutter position control points, a cumulative chord length parameterization method of a formula (9) is applied to reflect a distribution of data points according to a chord length:

$$\begin{cases} u_0 = u_1 = u_2 = u_3 = 0 \\ u_{i+3} = u_{i+2} + \sqrt{|P_{CL}^i - P_{CL}^{i-1}|} \Big/ \sum_{i=1}^{n} \sqrt{|P_{CL}^i - P_{CL}^{i-1}|}, \\ \qquad i = 1, 2, \cdots, n-1 \\ u_{n+3} = u_{n+4} = u_{n+5} = u_{n+6} = 1 \end{cases} \quad (9)$$

as long as there are control vertices $d_i$, a NURBS repair path of the ball-end micro-milling cutters is calculated; then weighted control vertices of the NURBS curve are inversely calculated;

for a cubic NURBS curve generated by n+1 $P_{CL}$, there are n+3 control vertices, and the cubic NURBS curve is defined as a formula (10), where $u \in [u_i, u_{i+1}] \subset [u_3, u_{n+3}]$;

$$p_i(u) = \sum_{j=i-3}^{i} d_j N_{j,k}(u) \quad (10)$$

$$p(u_{i+3}) = \sum_{j=i}^{i+3} d_j N_{j,3}(u_{i+3}) = P_{CL}^i, i = 0, 1, \cdots, n \quad (11)$$

substituting nodal values in a definition domain of the cubic NURBS curve into the equations in turn, and the cubic NURBS curve of different segments are continuous at the value points, which is defined as a formula (11); n+1 equations in the formula (10) and formula (11) are not enough to determine n+3 unknown weighted control vertices, so two additional equations (12) are given by boundary conditions:

$$p'_0(0) = \dfrac{3\dfrac{\omega_1}{\omega_0}(d_1 - d_0)}{u_4 - u_3} \cdot p'_n(1) = \dfrac{3\dfrac{\omega_{n+1}}{\omega_{n+2}}(d_{n+2} - d_{n+1})}{u_{n+3} - u_{n+2}} \quad (12)$$

$$\begin{bmatrix} 1 & & & & \\ a_2 & b_2 & c_2 & & \\ & \ddots & \ddots & \ddots & \\ & & a_n & b_n & c_n \\ & & & & 1 \end{bmatrix} \cdot \begin{bmatrix} d_1 \\ d_2 \\ \vdots \\ d_n \\ d_{n+1} \end{bmatrix} = \begin{bmatrix} e_1 \\ e_2 \\ \vdots \\ e_n \\ e_{n+1} \end{bmatrix} \quad (13)$$

linear equation sets in the equation (13) are obtained by the two additional equations (12); and all weighted control vertices are obtained; then the weighted control vertices are substituted into the equation (10) to obtain a NURBS curve equations set after interpolation of cutter position control point $P_{CL}$; there are n sets of the linear equation sets, and each of the linear equation sets has three equations; the three equations are the equations of u on x, y, and z components of a curve between adjacent cutter position control points $P_{CL}$; the three equations are second-order continuous at the cutter position control points $P_{CL}$; parameter equation is used as the repair path of the KDP crystal to realize digitization of the repair path, and only related parameter is the chord length u;

step 5: creating a graphical curve in a computer aided design software according to the mathematical model of the spatial curve, and using the graphical curve as the repair path to performed a machining process simulation; if a simulation result meets safety and manufacturability requirements of a machining cutter path, a step 6 is performed; if not, the step 2 is repeated to check the processing requirement and adjust the GPR path generation parameters;

wherein in the step 5, a calculated NURBS curve equation is imported into a CAM module of the computer aided design software; the machining process simulation is performed in a curve-driven manner, then whether the simulation result meets the safety and manufacturability requirements of the machining cutter path is checked; if the simulation result meets the safety and manufacturability requirements of the machining cutter path, step 6 is performed; if not, the step 2 is repeated to check the process and modify the GPR path generation parameters;

the step 6, converting the machining process simulation of the step 5 into general numerical control (NC) codes, and performing precision micro-milling repair on the KDP crystal on a KDP crystal repair machine;

wherein in the step 6, a conventional repair process simulation and a GPR variable-step-distance repair process simulation are converted into the NC codes through a post-processor of the computer aided design software, and the precision micro-milling repair of the KDP crystal is performed on the KDP crystal repair machine.

2. The variable-step-distance micro-milling repair cutter path generating method for the damage points on the surface of the optical crystal according to claim 1, wherein the damage repair profile in the step 1 is the conical repair profile; the depth and the width of the conical repair profile are selected according to morphology, size and distribution of the damage points on the surface of the KDP crystal; and the mathematical model of the conical repair profile is a quadric surface equation;

wherein the processing requirement in step 2 is a cutting step distance corresponding to a conventional spiral milling path; the GPR path generation parameters comprise polar angle adjustment parameters and polar diameter offset; according to generated parameters, a series of coordinates of the discrete contact points of a surface of the conical repair profile is calculated by a GPR algorithm; the discrete contact points are the cutter contact control points; when the cutter is milling the conical repair profile, a contact point set to a theoretical surface is the spatial curve, and the cutter contact control points are configured to control a trend of the spatial curve;

the micro-milling cutter in the step 3 is the ball-end micro-milling cutter made of CBN, the ball-end micro-milling cutter is configured to realize a plastic domain processing of a repair profile on the surface of the KDP crystal; when the ball-end micro-milling cutter performs milling motion on a surface of the conical repair profile of the KDP crystal, a sphere center motion path of the ball-end micro-milling cutter is the spatial curve that is defined as a cutter motion path or the cutter path; a point at a distance of the cutter radius outward from a normal direction of a cutter contact point is defined as a cutter position control point; the cutter position control points are configured to control the trend of the cutter path.

3. The variable-step-distance micro-milling repair cutter path generating method for the damage points on the surface of the optical crystal according to claim 2, wherein in the step 4, the cutter position control points are acted as curve value points, by the NURBS modeling method, to interpolate the $k^{th}$ NURBS spline curve.

4. The variable-step-distance micro-milling repair cutter path generating method for the damage points on the surface of the optical crystal according to claim 3, wherein in step 5 further comprises creating the graphical curve in the computer aided design software according to the mathematical model of the spatial curve, saving obtained curve equations as an .exp format file, and importing the EXP format file into the computer aided design software in an expression form to make a regular curve; and performing an intuitive machining process simulation to confirm safety and reliability of the machining process by driving the regular curve;

wherein in step 6, a process of converting the machining process simulation of step 5 into the NC codes depends on the post-processor of the computer aided design software.

\* \* \* \* \*